United States Patent [19]

Thornquist

[11] Patent Number: 4,568,410
[45] Date of Patent: Feb. 4, 1986

[54] SELECTIVE PLASMA ETCHING OF SILICON NITRIDE IN THE PRESENCE OF SILICON OXIDE

[75] Inventor: Steven C. Thornquist, Tucson, Ariz.

[73] Assignee: Motorola, Inc., Schaumburg, Ill.

[21] Appl. No.: 683,843

[22] Filed: Dec. 20, 1984

[51] Int. Cl.[4] .................... B44C 1/22; C03C 15/00; C03C 25/06
[52] U.S. Cl. .................... 156/643; 156/646; 156/653; 156/657; 204/192 E; 252/79.1
[58] Field of Search ............ 156/643, 646, 653, 657, 156/659.1, 662; 204/164, 192 EC, 192 E; 427/38, 39; 252/79.1

[56] References Cited

U.S. PATENT DOCUMENTS

| 4,314,875 | 2/1982 | Fhamm | 156/662 X |
| 4,484,979 | 11/1984 | Stocker | 252/79.1 X |
| 4,529,476 | 7/1985 | Kawamoto et al. | 156/646 X |

Primary Examiner—William A. Powell
Attorney, Agent, or Firm—Robert M. Handy

[57] ABSTRACT

Silicon nitride can be etched at a rapid rate selectively against oxide in a gas plasma formed from a gas mixture comprising 10–20 parts $NF_3$ to 20–35 parts $O_2$, by volume. Silicon nitride etch rates in the range 55 to 75 milli-microns per minute are obtained at nitride/oxide etch rate ratios of 8–11:1. In contrast to the prior art methods, the invented gas system contains no carbon. Hence, deposition of carbon complexes on the substrate wafers or reactor walls during nitride etching is avoided. The $NF_3 + O_2$ gas mixture also etches common resists.

15 Claims, 5 Drawing Figures

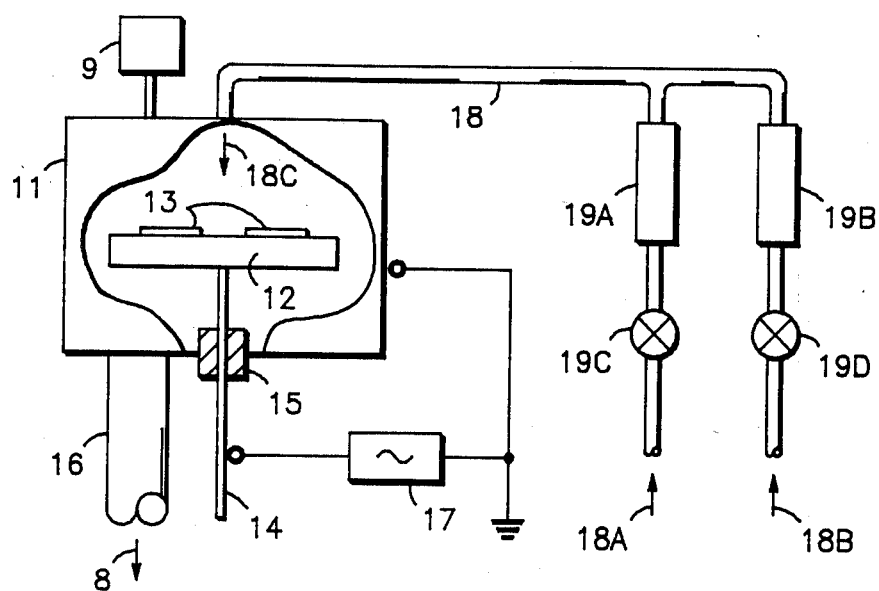
FIG. 1
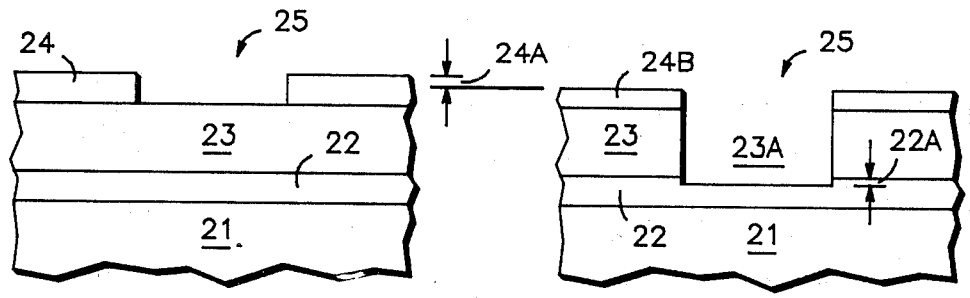
FIG. 2A (BEFORE)   FIG. 2B (AFTER)
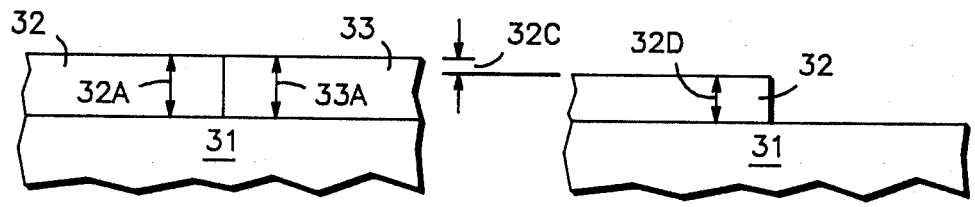
FIG. 3A (BEFORE)   FIG. 3B (AFTER)

४,568,410

1

SELECTIVE PLASMA ETCHING OF SILICON NITRIDE IN THE PRESENCE OF SILICON OXIDE

FIELD OF THE INVENTION

This invention relates in general to methods for dry etching of materials important in semiconductor manufacture and, more particularly, to improved methods for plasma etching of silicon nitride and selective etching of silicon nitride relative to silicon oxide.

BACKGROUND ART

It is commonplace in semiconductor device manufacture to utilize layers of materials such as silicon nitride and silicon oxide. These layers are patterned to cover selected regions of the semiconductor wafer or other substrate. The patterned layers are used as etch masks during wafer processing or as insulating dielectrics which electrically isolate different conductors or device regions, or both. An example of the use of silicon nitride and silicon oxide layers for fabrication of semiconductor devices and integrated circuits is described in U.S. Pat. No. 4,199,380 to M. G. Farrell et al., which is incorporated herein by reference.

During wafer processing, it is important to be able to etch materials selectively, that is, to be able to etch one material at a much faster rate than another material when both materials are simultaneously exposed to the same etchant. Etch selectivity permits the slower etching material to be used as a mask for the faster etching material. Silicon nitride and silicon oxide are known to form a pair of materials exhibiting etch selectivity. Well-known reagent systems exist for carrying out selective etching of silicon nitride and silicon oxide by wet chemistry.

More recently, there has arisen great interest in dry etching, that is, chemical etching systems which do not use wet chemistry. It has been found that many of the materials used in semiconductor manufacture can be etched by exposure to gaseous plasmas containing the proper active species. These techniques are generally referred to as reactive ion etching or plasma etching.

It is well-known that silicon based materials can be etched by plasmas formed from certain halogen compounds, carbon-halogen compounds, and mixtures thereof. For example, it is reported in U.S. Defensive Publication No. T101,302 that silicon can be preferentially etched in a plasma formed from $CF_4+Cl_2$. It is reported in U.S. Pat. No. 4,414,057 that silicon can be etched using a plasma formed in a mixture of $C_2F_6+Cl_2$. It is reported in U.S. Pat. No. 4,406,733 that $PF_5$ and $PCl_3$ are useful for etching silicon, in U.S. Pat. No. 4,380,489 that $SF_6$ is useful for etching silicon, and in U.S. Pat. No. 4,310,380 that $ClF_3$ or $NF_3$ or $BrF_3$ or $IF_3$ or $ClF_3+Cl_2$ are also useful for etching silicon. These patents and defensive publication are incorporated herein by reference.

It is further known that silicon oxide and silicon nitride can be etched in gaseous plasmas. For example, U.S. Pat. No. 4,352,724 describes plasma etching of silicon nitride and silicon oxide using mixtures of various carbon-halogens and oxygen, in particular for etching silicon oxide $C_2F_5Cl+CF_4$, or $CF_4+O_2$, or $CF_4$ are useful, and for etching silicon nitride, $C_2F_5Cl+CF_4+O_2$, or $CF_4$, or $CCl_4$, or $PCl_3$, or $BCl_3$, or $SiCl_4$, or other chloride gases with $O_2$ or $CF_4$ are useful. It is reported in U.S. Pat. No. 4,374,698 that silicon nitride and silicon oxide can be selectively plasma etched using mixtures of $CF_4+CF_2Cl_2+O_2$, or $CF_4+CF_3Br+O_2$, or $CF_4+CF_3Br+NO$, and that ratios of nitride etch rate to oxide etch rate of 5:1 to 12:1 can be obtained, with nitride etch rates ranging from about 2 to 25 millimicrons per minute. These patents are incorporated herein by reference.

Nitride to oxide etch rate ratios above about 2:1 are sufficient to permit selective etching of nitride layers on top of oxide layers, which is a frequently encountered situation. However, larger etch rate ratios are desirable. A deficiency of the prior art procedures and gas compositions for plasma etching of nitride and oxide layers is that they employ carbon-halogen compounds. It has been found that carbon-halogen compounds are a source of contamination within the plasma chamber, particularly when hydrogen bearing compounds such as resists are present on the substrate or in the chamber during plasma etching, as is common. Carbon dissociated from the carbon-halogen compounds forms non-volatile complexes which deposit on the walls of the plasma reactor and on the semiconductor substrates. This produces undesirable contamination.

Thus, a need continues to exist for plasma etching methods and materials which avoid the contamination problems associated with prior art methods and gases and which provide adequate selectivity and etch rates.

Accordingly, it is an object of the present invention to provide an improved method and gas mixture for selective plasma etching of nitride compounds and oxide compounds which avoids carbon or hydro-carbon related contamination products.

It is a further object of the present invention to provide an improved plasma etching method and plasma gas which avoids carbon related contamination while achieving selective etching of nitride to oxide.

It is an additional object of the present invention to provide an improved plasma etching method and plasma gas which avoids carbon related contamination, which achieves absolute nitride etch rates as well as selective nitride to oxide etch ratios in the same range or higher than the prior art.

It is a further object of the present invention to provide an improved plasma etching method and plasma gas which uses readily available and easily purified source gases which are relatively inexpensive and easy to handle during wafer manufacturing.

SUMMARY OF THE INVENTION

The attainment of the foregoing and other objects and advantages is achieved through the present invention wherein there is provided a dry process for fabricating semiconductor devices by etching of a nitride layer, comprising providing a body having thereon a nitride layer and exposing a portion of the nitride layer to a plasma in a gas mixture derived from a nitrogen flouride and oxygen. The oxygen may be derived from any source but is conveniently introduced as $O_2$. The nitrogen fluoride is conveniently $NF_3$. It is desirable for the gas mixture to be composed of 20–35 parts by volume $O_2$ to 10–20 parts by volume $NF_3$. It is desirable that the total pressure of the gas mixture exceed 50 milli-Torr (6.7 Pa). Where silicon nitride and silicon oxide are both exposed to the plasma the etching of the silicon nitride proceeds at a higher rate than the silicon oxide, the nitride to oxide etch rate ratio being approximately in the range 8–11:1.

BRIEF DESCRIPTION OF THE DRAWINGS

FIG. 1 is a simplified schematic drawing of a plasma reactor system suitable for etching.

FIGS. 2A-B and 3A-B are simplified schematic cross-sectional diagrams through portions of semiconductor wafers, before and after etching.

DETAILED DESCRIPTION OF THE DRAWINGS

FIG. 1 shows in simplified schematic form a plasma reactor system 10 suitable for etching of semiconductor wafers 13. Reactor system 10 comprises housing 11 within whith is located wafer support 12 on which are placed wafers 13. Wafer support 12 and housing 11 are generally electrically conductive and provide the electrodes for forming the plasma. They are isolated by insulator 15. Power supply 17 is connected between housing 11 and wafer support 12. Generally power supply 17 provides high frequency energy to form a plasma within enclosure 11 in contact with wafers 13. Plasma gas mixture 18c is derived from source gases 18a-b which are supplied to reactor system 10 through flow meters or regulators 19a-b and control valves 19c-d via manifold 18. Pressure gauge 9 is used to measure the total gas mixture pressure within housing 11. Spent gases 8 are removed from housing 11 via exhaust pipe 16 by means of a vacuum pump (not shown). The series AME 8110 reactors manufactured by Applied Material, Inc., Santa Clara, CA are suitable. The reactor design is not a part of this invention.

FIGS. 2A-B show portion 20 of semiconductor wafer or substrate 21 having thereon surface oxide layer 22, superposed nitride layer 23, and resist layer 24. Where wafer or substrate 21 is of silicon, oxide layer 22 and nitride layer 23 are also conveniently compounds of silicon. The silicon oxide and silicon nitride layers are prepared by means well-known in the art.

Layer 24 is typically of photoresist and has opening or pattern 25 prepared by means well-known in the art. Resist 24 must be of a type and thickness sufficient to withstand exposure to a plasma during etching of nitride layer 23, since in general it will also be etched to some degree. FIG. 2A shows wafer portion 20 before plasma etching and FIG. 2B shows wafer portion 20 after plasma etching. Resist layer 24 protects nitride layer 23 except in opening 25, wherein portion 23a of nitride layer 23 is etching during exposure to a plasma, according to the method of the present invention. In general, resist layer 24 is eroded by amount 24a during etching of portion 23a. The relative thicknesses of the layers in FIGS. 2A-B are not to scale. In particular, resist layer 24 may sometimes be five to ten times as thick as either layers 22 or 23.

A wafer or substrate will generally have a multiplicity of holes 25, usually of different lateral dimensions. This causes the etching of nitride layer 23 to vary slightly from hole to hole. Thus, on one portion of the wafer, all of the nitride exposed in a first mask opening will be etched away and the underlying oxide exposed, while in another portion of the wafer, some nitride still remains to be etched in a second mask opening. Additionally, the nitride layer itself may not be of uniform thickness. Under these circumstances, it is desirable to over-etch slightly to insure that the nitride is fully removed in all holes. Because the ratio of the nitride to oxide etch rates is not infinite, some etching of oxide layer 22 will occur during over-etching in those portions of the wafer where nitride layer portion 23a disappears first. This is illustrated in FIG. 2B by over-etch depth 22a. So long as the nitride etch rate is several times the oxide etch rate, over-etch depth 22a is generally not troublesome.

Another frequently encountered situation is depicted in FIGS. 3A-B. FIGS. 3A-B show simplified schematic cross-section of portion 30 of wafer or substrate 31 having on its surface oxide region 32 of thickness 32a and nitride region 33 of thickness 33a. FIG. 3A depicts the situation before etching and FIG. 3B depicts the situation after etching. In FIGS. 3A-B, regions 32 and 33 are depicted as being adjacent and of equal thickness, but this is merely for purposes of illustration and is not essential. After etching according to the method of the present invention, nitride layer 33 has been removed and substrate 31 exposed while, due to the selective nature of the etching process, oxide region 32 has only been etched by amount 32c, leaving behind thickness 32d. Those of skill in the art will appreciate that by adjusting initial thickness 32a of layer 32, reduced thickness 32d after etching can still be made large enough to serve as a mask for further processing or as a dielectric layer for electrical isolation between substrate 31 and a conductor (not shown) subsequently placed on top of etched layer 32. Those of skill in the art will also appreciate that while substrates 21 and 31 have been illustrated as being semiconductor wafers, they can also be of other materials, or can be semiconductor wafers which have other surface layers underlying layer 22 or regions 32 and 33. Hence, as used herein the words wafer or substrate are intended to include all such variations.

It was found that a plasma formed in a gas mixture made from a nitrogen fluoride and oxygen is useful for etching silicon nitride. Moreover, this mixture is selective, etching silicon nitride eight to eleven times faster than silicon oxide. The best composition is a compromise between the desire to have a high nitride etch rate, a low oxide etch rate, and a sufficiently low resist etch rate. This is because resists are usually needed for the outermost masking layer. The following illustrates the practice of the method of the present invention.

EXAMPLE

Silicon wafers were oxidized using conventional techniques to obtain silicon oxide layers from 40 to 300 milli-microns in thickness on the various wafers. The thicknesses of the oxide layers were determined using standard techniques. Some of the wafers were placed directly in the plasma reactor and exposed to the plasma to determine the oxide etch rate. Others of the oxidized wafer were placed in a standard CVD reactor and a silicon nitride layer 100 to 500 milli-microns thick applied over the oxide, using conventional techniques. The thicknesses of the nitride layers were determined using conventional techniques. Some of these wafers were placed directly in the plasma reactor and etched to determine the nitride etch rate. Remaining wafers were coated with a photoresist layer of approximately 1-2 microns thickness and a pattern of holes developed therein using conventional techniques. Kodak type 820 resist available from Eastman Kodak Co., Rochester, N.Y. was typically used. The wafers were plasma etched in a Model AME 8110 plasma reactor manufactured by Applied Materials, Inc., Santa Clara, Calif. The etching gas was formed from a gas mixture of $NF_3$ and $O_2$. In a typical run, the flow rates of the gases were adjusted to give about 20 standard cubic centimeters per minute (SCCM) of $NF_3$ and about 25 SCCM of $O_2$. The total system pressure was about 120 milli-Torr (16 Pa). RF power input to the reactor was 1200–1300 watts, and the floating DC potential of the conductive wafer support was about −400 volts with respect to the housing.

Wafers with various layers having known thicknesses were exposed to this plasma for measured periods of time, removed and the remaining layer thickness measured. From these measurements, the absolute and relative etch rates of silicon nitride, silicon oxide, and resist were determined. Wafers having oxide layers, nitride layers, resist layers, and combinations thereof were placed in the reactor at the same time so as to determine the relative and absolute etch rates under conditions similar to routine device fabrication. It was found that under the plasma operating conditions described above, the nitride and resist etch rates were about 75 milli-microns per minute, and the oxide etch rate was about 9 milli-microns per minute, giving a nitride/oxide etch ratio of about 8.3:1.

The relative etch rate of the nitride, oxide and resist can be varied by varying the gas mixture composition and plasma operating conditions. At 20 SCCM $O_2$ and 10 SCCM $NF_3$, 1250 watts RF, and total pressure of about 80 milli-Torr (10.6 Pa), the nitride etch rate was about 55 milli-microns per minute and the oxide etch rate was about 5 milli-microns per minute, which gives a nitride/oxide etch ratio of about 11:1.

Etch uniformity was generally about ±2% across a 100 mm wafer for nitride and about ±12% for oxide. Run to run repeatability of etch rates was about ±10%. No loading effect was observed, i.e., the etch rates were independent of the number of wafers placed in the chamber at the same time.

The poorer etch uniformity of the oxide is generally not a problem, since it is the nitride which is intended to be etched preferentially to the oxide. For the configuration of FIGS. 2A–B, the oxide is only exposed during the over-etch portion of the cycle, hence the oxide etching is minimal and even a 12% variation in oxide etch rate has negligible effect. For the configuration of FIGS. 3A–B, or the like, the oxide is continually exposed to the plasma during etching of the nitride layer. Under these circumstances, initial thickness 32a of oxide layer 32 can be increased so that thickness 32d remaining after nitride etching is adequate despite a ±12% non-uniformity in oxide etch rate across the wafer.

Increasing the oxygen content of the gas mixture improves the nitride to oxide etch rate ratio (i.e., the oxide etch rate decreases relative to the nitride etch rate), but decreases the nitride to resist etch rate ratio (i.e., the resist etch rate increases relative to the nitride etch rate). Nitride/oxide selectivity is best, i.e., the largest nitride to oxide etch ratio is obtained, when total gas flow is low, i.e. in the range 30–55 SCCM, and pressure is relatively high, i.e., above about 50 milli-Torr (6.7 Pa), and the $NF_3$ to $O_2$ ratio is at or below one. It was found that good results were obtained with a gas mixture composition in the range 10–20 parts by volume $NF_3$ combined with 20–35 parts $O_2$. These mixtures were obtained by varying the flow rates of the separate source gases by setting the flow rate of the $NF_3$ to be in the range 10–20 SCCM and the flow rate of the $O_2$ to be in the range 20–35 SCCM.

The invented process and gas mixture are useful for device fabrication even though the nitride to resist etch ratio is in the range 1±0.5:1. This is because the typical thickness of the nitride layers to be etched is only of the order of a few tenths of microns or less while resist thicknesses can be of the order of a micron or more. Thus a thickness of resist equal to one to two times the nitride thickness can readily be sacrificed during nitride etching without risk that the resist will be entirely consumed and its masking function lost. Hence, the roughly 1:1 nitride to resist etch ratio is not troublesome.

Conversely, a large nitride to oxide etch ratio is generally wanted since it is common to be etching nitride layers of a few tenths of microns above an oxide layer of a few hundredths of microns. Thus, a nitride/oxide etch ratio about 4:1 is highly desirable. This is provided by the present etching method and gas composition wherein nitride/oxide etch ratios in the range 8–11:1 are obtained. A further feature of the present invention is that absolute nitride etch rates in the range of 55 to 75 milli-microns per minute are obtained. Thus, a typical 200 milli-micron thick nitride layer can be etched through in 3 to 4 minutes. This is a great manufacturing convenience. This is to be compared with the prior art results, reported in U.S. Pat. No. 4,374,698, of nitride etch rates of less than about 25 milli-microns per minute at nitride/oxide etch rate ratios of about 2.5:1, and nitride etch rates of less than about 20 milli-microns per minute at etch rate ratios in the range 8–10:1. The present invention provides larger absolute nitride etch rates at comparable or larger nitride/oxide etch rate ratios.

A particular feature of the present invention is that the source gases used for etching contain no carbon. This is important since carbon has been found to cause contamination in the etching chamber and on the wafers when carbon-halogen source gases are used. The prior art carbon-halogen gases or gas mixtures are known to be etchants in varying degrees for silicon, silicon compounds, and common resists. When resists are present hydrogen or hydrogen complexes can be released into the plasma and react with the carbon ions from the dissociated carbon-halogen gases. Hydrocarbons, silanes, combinations thereof, and other complex carbon based molecules are often formed when the prior art carbon-halogen gases are used in the presence of resists or other organic materials which may be present in the chamber. Many of these complex molecules condense at relatively low temperatures and deposit on the chamber walls and wafers as unwanted contamination. This effect is avoided by applicants' method which employs $NF_3$ rather than carbon-halogens as a halogen source. By comparison $NF_3$ is clean and easily handled during wafer processing. Further, the process steps associated with removing any residual carbon based contamination from the wafers, substrates, or chamber walls and parts as are required with the prior art carbon-halogen gases, are avoided. Thus, the invented process and source gas is more convenient as well as cleaner.

Having thus described the invention, it is apparent that the present invention provides an improved process and gas mixture for etching silicon nitrides, and particularly for selective etching of silicon nitrides in the presence of silicon oxides. Further, carbon based contamination present with the prior art methods and source gases is avoided while still achieving higher etch rates and comparable etch ratios for silicon nitride. While the invented process has been illustrated for particular reactor systems, it will be understood by those of skill in the art that the invented method and source gases can be used with other etching apparatus. Accordingly, it is intended to include all such variations in the claims which follow.

I claim:

1. A dry selective etching process for nitride in the presence of oxide comprising, providing a body having thereon a nitride and an oxide, and exposing said nitride to a gaseous plasma prepared from a nitrogen fluoride source gas and an oxygen yielding source gas to etch said nitride at a higher rate than said oxide.

2. The process of claim 1 wherein said body is of a semiconductor material and said nitride and said oxide comprise said material.

3. The process of claim 2 further comprising etching said nitride at a rate more than twice the rate of etching of said oxide.

4. The process of claim 3 further comprising etching said nitride at a rate more than four times the rate of etching of said oxide.

5. The process of claim 1 wherein said gaseous plasma is prepared from oxygen gas and nitrogen tri-fluoride gas in proportions in the range 20–35 parts oxygen to 10–20 parts nitrogen tri-fluoride by volume.

6. The process of claim 1 further comprising exposing said nitride and oxide to said gaseous plasma at a pressure of more than 50 milli-Torr (6.7 Pa).

7. A process for fabricating semiconductor devices comprising, providing a semiconductor wafer having thereon a nitride region and an oxide region, exposing said wafer to a gaseous plasma formed from a mixture of oxygen and $NF_3$ in the range 20–35 parts by volume oxygen to 10–20 parts by volume $NF_3$, and terminating said exposing step when a predetermined portion of said nitride has been removed.

8. The process of claim 7 wherein said semiconductor is silicon and said nitride comprises silicon nitride and said oxide comprises silicon oxide.

9. The process of claim 7 wherein said providing step comprises providing a semiconductor wafer having thereon a nitride region overlying an oxide region.

10. The process of claim 7 further comprising exposing said nitride and oxide regions to said gaseous plasma at a pressure of more than 50 milli-Torr (6.7 Pa).

11. A process for fabricating semiconductor devices including preferential etching of silicon nitride versus silicon oxide, comprising:
providing a semiconductor wafer having thereon a silicon nitride region overlying a silicon oxide region;
covering said semiconductor wafer with a masking layer having windows exposing predetermined portions of said silicon nitride region;
placing said semiconductor wafer in a chamber adapted to provide a gaseous plasma;
introducing into said chamber a gas mixture comprising oxygen and $NF_3$ in the ratio 20–35 parts oxygen to 10–20 parts $NF_3$ by volume;
initiating said gaseous plasma using said gas mixture;
etching said predetermined portions of said silicon nitride layer exposed in said windows using said gaseous plasma;
continuing said etching step until said predetermined portions of said silicon nitride region have been removed and said silicon oxide underlying said predetermined portions of said silicon nitride region exposed; and
thereafter terminating said plasma and removing said wafer.

12. The process of claim 11 further comprising exposing said predetermined portions of said silicon nitride region to said gaseous plasma at a pressure of more than 50 milli-Torr (6.7 Pa).

13. A dry process for etching silicon nitride comprising exposing said silicon nitride to a gaseous plasma formed from a mixture comprising $O_2$ and $NF_3$.

14. The process of claim 13 wherein said mixture comprises $O_2$ and $NF_3$ in the ratio 20–35 parts $O_2$ to 10–20 parts $NF_3$ by volume.

15. The process of claim 14 wherein said exposure step further comprises exposing said nitride to said gaseous plasma at a pressure exceeding 50 milli-Torr (6.7 Pa).

* * * * *